United States Patent [19]

Tsunashima

[11] Patent Number: 4,575,920
[45] Date of Patent: Mar. 18, 1986

[54] METHOD OF MANUFACTURING AN INSULATED-GATE FIELD-EFFECT TRANSISTOR

[75] Inventor: Yoshitaka Tsunashima, Tokyo, Japan

[73] Assignee: Kabushiki Kaisha Toshiba, Japan

[21] Appl. No.: 606,403

[22] Filed: May 2, 1984

[30] Foreign Application Priority Data

Sep. 28, 1983 [JP] Japan .................. 58-179551

[51] Int. Cl.⁴ .......................... H01L 21/425
[52] U.S. Cl. ...................... 29/571; 29/576 B; 29/591; 148/1.5; 148/187
[58] Field of Search .......... 29/571, 576 B, 591; 148/1.5, 187

[56] References Cited

U.S. PATENT DOCUMENTS

| | | | |
|---|---|---|---|
| 4,079,504 | 3/1978 | Kosa | 29/571 |
| 4,442,589 | 4/1984 | Doo et al. | 29/571 |
| 4,458,410 | 7/1984 | Sugaki et al. | 29/591 |
| 4,485,550 | 12/1984 | Koeneke et al. | 29/571 |
| 4,498,224 | 2/1985 | Maeguchi | 148/1.5 X |

FOREIGN PATENT DOCUMENTS 52-135685 11/1977 Japan .
58-18965 2/1983 Japan .

OTHER PUBLICATIONS

Horiuchi et al., "Paper of the 44th Technological Symposium of Japanese Applied Physics Society", 1983, p. 391, Abstract 26p-M-7.

Primary Examiner—George T. Ozaki
Attorney, Agent, or Firm—Banner, Birch, McKie & Beckett

[57] ABSTRACT

A method of manufacturing an insulated-gate field-effect transistor on a silicon substrate at high density for large scale integration is disclosed. The source and drain regions of the transistor are formed by implanting low density impurity ions into the silicon substrate and then heating the substrate at a temperature in the range of 900° to 1300° C. Thereafter, additional ions are implanted into the source and drain regions, and the substrate is heated at a second temperature of 700° C., or lower, to provide good ohmic contact between metal electrodes and the source and drain regions. In addition, the sheet resistivity of the source and drain regions is small so that high speed operation of the transistor is achieved.

14 Claims, 9 Drawing Figures

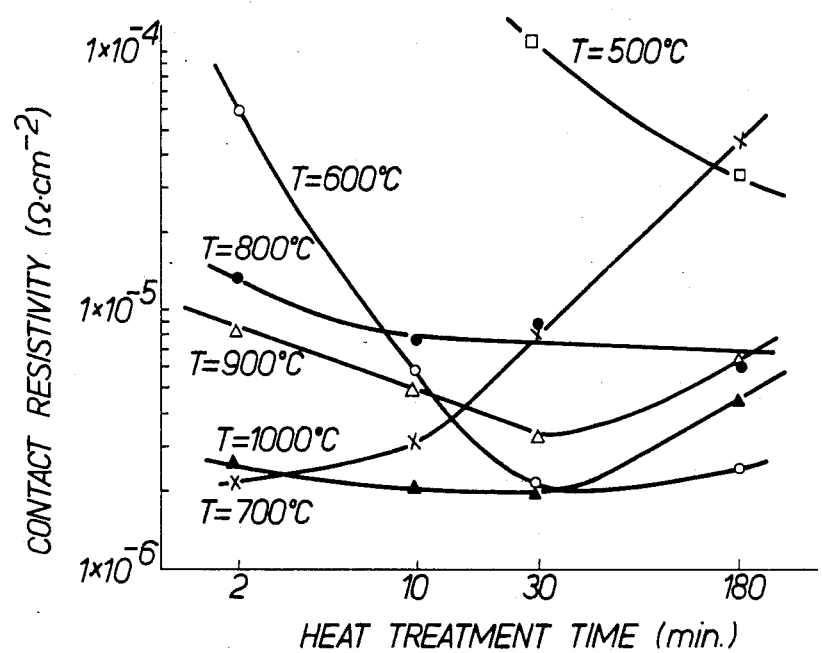
FIG./.

METHOD OF MANUFACTURING AN INSULATED-GATE FIELD-EFFECT TRANSISTOR

BACKGROUND OF THE INVENTION

The present invention relates to a method of manufacturing an insulated-gate field-effect transistor device which is suitable for large scale integrated circuits.

In large scale integration, it is necessary to minimize the size of insulated-gate field-effect transistors (hereinafter referred to as "MOS transistors") in order to fabricate an integrated circuit of high density. However, as an MOS transistor is decreased in size, the channel between its source and drain is shortened and the threshold voltage for inverting the channel region decreases, which results in poorer switching characteristics. This phenomenon is called "short channel effect." For example, in the manufacture of MOS transistors, the source and drain regions are generally formed by diffusing impurities. If the source and drain regions are formed deeply, then impurities may be diffused into the channel regions to reduce the effective channel length resulting in the so-called short channel effect.

To prevent the short channel effect, it is necessary to make the source and drain regions shallow. On the other hand, the source and drain regions normally must have a small resistance for high speed operation of the MOS transistor and a high impurity concentration for good ohmic contact with the electrodes mounted on these regions.

It is difficult to form source and drain regions of high impurity density and a small depth by using known diffusion and ion implantation techniques. The reason for this is that the introduction of impurities into the silicon substrate is followed by heating the silicon substrate at 900° C. or higher in order to activate the impurities, which further diffuses the impurities. Also, if the impurity density is high in the drain region, then hot electrons may be produced due to the concentration of an electric field in the vicinity of the PN junction formed between the drain region and the silicon substrate. These hot electrons may be trapped in the gate insulating film of the MOS transistor and thereby change the threshold voltage of the MOS transistor.

A known technique to prevent injection of such hot electrons is to form each of the source and drain regions in two layers of different impurity concentrations. More specifically, each of the source and drain regions includes a first layer of low impurity concentration and small depth and a second layer formed in the first layer. The second layer has a high impurity concentration and a depth smaller than that of the first layer. The first and second layers are normally formed by ion implantation so that the dose and depth of impurities introduced into the silicon substrate can be easily controlled. In such an MOS transistor, the first layer of low impurity concentration decreases the electric field in the vicinity of the PN junction between the drain region and the silicon substrate to suppress injection of hot electrons.

In the manufacture of the above MOS transistor, after formation of each of the first and second layers, the substrate is heated at a high temperature of 900° C. or higher to lower the resistance of the source and drain regions and to provide good ohmic contact with the electrodes. However, the repetitive heating of the substrate at such a high temperature causes the first layer to diffuse deeper into the substrate and makes it difficult to form a second layer of high impurity concentration and small depth. As a result, it is difficult to minimize the size of the MOS transistor and prevent the occurrence of the short channel effect.

SUMMARY OF THE INVENTION

Accordingly, it is an object of the present invention to provide a method of manufacturing an insulated-gate field-effect transistor having source and drain regions of small depth to prevent the short channel effect.

Another object of the present invention is to provide a method of manufacturing an insulated-gate field-effect transistor which prevents changes in the threshold voltage due to injection of hot electrons.

According to the present invention, the above objects can be achieved by a particular method of manufacturing an insulated field-effect transistor. After preparing a silicon substrate of a first conductivity type having an insulated layer around a predetermined surface portion, a gate insulating film and a gate electrode are formed on a portion of the predetermined surface portion. The gate electrode is formed on the insulating film. Source and drain regions of a second conductivity type are formed between the insulating layer and the gate electrode by ion implantation of impurity ions. The source and drain regions, which are spaced apart, have a low impurity concentration. The substrate is heated at a first temperature in the range of 900° to 1300° C. Then additional ions are implanted into the source and drain regions and the substrate is heated again at a second temperature of 700° C. or lower. This second temperature preferably should be in the range of 500° to 700° C. to provide good ohmic contact between the electrodes and the source and drain regions. Finally, metal electrodes are formed in ohmic contact with the source and drain regions.

In the field effect transistors of the present invention, the metal electrodes substantially decrease the resistance of the source and drain regions to increase operating speed. Ion implantation and subsequent heating at the second temperature of 700° C. or lower provides good ohmic contact between the electrodes and the source and drain regions. Also, by providing an ion implantation technique for forming the source and drain regions of low impurity concentration and small depth, the present invention makes possible the manufacture of insulated-gate field-effect transistors of very small size and desirable characteristics, such as proper threshold voltage.

The above and other objects, features and advantages of the present invention will become more apparent from the following description when taken in conjunction with the accompanying drawings.

BRIEF DESCRIPTION OF THE DRAWINGS

FIG. 1 is a graph showing the relationship between contact resistivity, temperature and heating times.

DESCRIPTION OF THE PREFERRED EMBODIMENTS

Figure 2A:
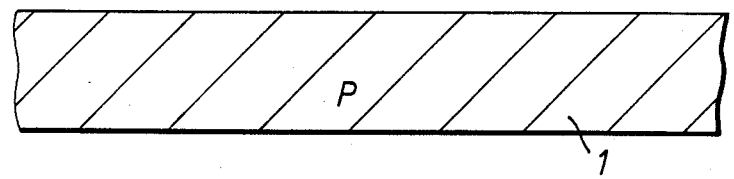
FIGS. 2(*a*) through 2(*h*) are cross-sectional views of a silicon substrate showing the steps of the method of manufacturing an insulated-gate field-effect transistor according to an embodiment of the invention.

Experiments were conducted as part of the present invention to determine whether good contact resistance could be obtained by heating a silicon substrate at low temperature. A P-type silicon substrate was prepared having a (100) surface orientation and a resistivity ranging from 6 to 8 '$\Omega \cdot cm^{-2}$. Boron was used as the substrate impurity. An oxidized layer was selectively applied to the substrate to insulate or separate a predetermined surface region on the substrate. Thereafter, arsenic (As) ions were implanted at an acceleration voltage of 40 KeV with a $3 \times 10^{15}$ cm$^{-2}$ dose into the predetermined surface region. The ion implantation was followed by heating the entire substrate at various temperatures to form an impurity region. An aluminum-silicide electrode having a thickness of 0.8 μm and containing 1 weight % of silicon was formed on the impurity region by a plasma-sputtering apparatus. The substrate was kept at a temperature of 120° to 130° C. during use of the plasma-sputtering apparatus.

FIG. 1 illustrates the relationship between the contact resistivities of the impurity region and the electrode, heating time and temperature. FIG. 1 shows that, when the substrate is heated at a temperature of 800° C. or higher, the contact resistivity decreases without being appreciably affected by the heat treatment time. One explanation for this result is that the implanted impurities are sufficiently activated by the high temperature to increase carrier density and allow the carriers to penetrate through the contact interface with ease, which thereby reduces contact resistivity.

FIG. 1 also shows that contact resistivity can increase under various conditions including: heating the substrate for about 2 minutes at a temperature of 700° C.; heating the substrate for about 30 minutes at a temperature of 600° C.; and heating the substrate for more than 180 minutes at a temperature of 500° C. This decrease in contact resistivity probably occurs because, when ions are implanted in a monocrystalline silicon substrate, the implanted layer turns into an amorphous state. In low temperature heating, this amorphous layer is progressively crystallized from the amorphous crystal interface. Progressive crystallization allows the impurities of the implanted layer to enter into the lattice points of the silicon crystal, which increases the carrier density. In addition, small defects in the implanted layer, which have not disappeared during low temperature heating, serve as carrier recombination centers which increase the carrier density. As a result, the width of the depletion layer on the surface of the silicon substrate is reduced so that carriers easily penetrate the contact interface resulting in lower contact resistivity.

Contact resistivity increases when the heat treatment time is increased at a temperature of 700° C. It is believed that the impurities, which have once entered into the lattice points in a quantity greater than the maximum solid solubility, return to positions between the lattice points, or that the number of small defects is reduced, or that the silicon atoms located at positions among the lattice points, and constituting the small defects, are replaced by the impurities in the lattice points. Contact resistivity also increases when the heat treatment time is shortened at a temperature of 600° or 500° C. It is believed that, in this case, the amorphous layer formed by ion implantation is insufficiently crystallized and has a low carrier density.

It is possible to decrease contact resistivity by low temperature heating, i.e., at a temperature of 700° C. or lower. However, the temperature should preferably be in the range of 500° to 700° C. to achieve good contact resistivity in a relatively short heating time. Small contact resistivity also can be attained by implantation of phosphorus ions, boron ions, or silicon ions, but not arsenic ions.

Figure 2B:
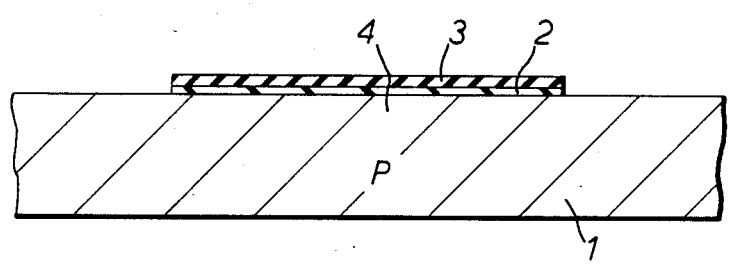
Figure 2C:
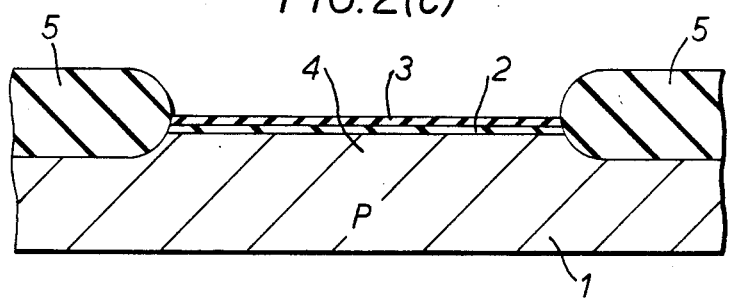
Figure 2D:
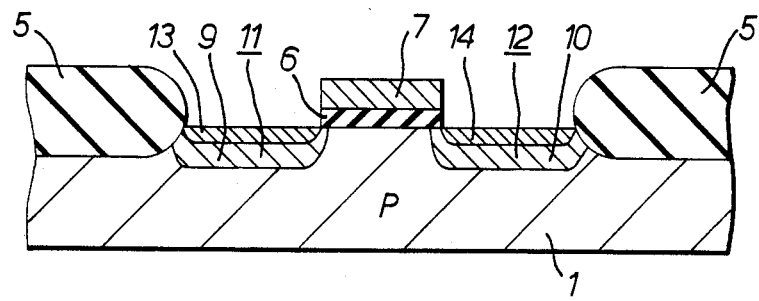

A method of manufacturing an insulated-gate field-effect transistor according to an embodiment of the present invention will hereinafter be described with reference to FIGS. 2(a) through 2(h). A P-type silicon substrate 1 containing boron is shown in FIG. 2(a) having a (100) surface orientation and a resistivity of 6 to 8$\Omega \cdot^{-2}$cm (FIG. 2(a)). As shown in FIG. 2(b), thin oxide film 2 having a thickness of 1000 Angstrom units is formed on substrate 1, and thin film 3 of silicon nitride having a thickness of 2000 to 2500 Angstrom units is formed on oxide film 2. These films 2 and 3 are patterned to form predetermined surface region 4 on which an MOS transistor is formed by a conventional photoengraving process. Silicon substrate 1 then is oxidized for 210 minutes at 1000° C. in a mixed gas atmosphere of oxygen and water vapor, which results in the selective growth of field oxide film 5 to a thickness of 8000 Angstrom units as illustrated in FIG. 2(c). Thereafter, oxide film 2 and silicon nitride film 3 are removed. Substrate 1 then is oxidized at 1000° C. in a dry oxygen atmosphere to form a thin oxide film of 200 Angstrom units. A polycrystalline silicon film of a thickness of 3000 Angstrom units is formed on the oxide film at a temperature of 600° C. by a low pressure chemical vapor deposition process using silane gas. These films then are etched by a conventional photoengraving process to form oxidized film 6 and gate electrode 7 of the insulated-gate field-effect transistor as shown in FIG. 2(d). Subsequently, a first ion implantation process is performed on substrate 1 using polycrystalline gas electrode 7 and field oxidized film 5 as a mask. This first ion implantation process is carried out with a dose value of $5 \times 10^{14}$ cm$^{-2}$ of arsenic (As) ions at an acceleration voltage of 40 KeV. These ions not only penetrate substrate 1 but also gate electrode 7 in order to decrease the resistance of gate electrode 7. After the first ion implantation process, substrate 1 is heated at a first temperature of 1000° C. for 30 minutes to form shallow N-type diffusion regions 9 and 10 of a low purity concentration as shown in FIG. 2(d). Diffusion regions 9 and 10 serve as source and drain regions 11 and 12, respectively, of the MOS transistor. Then, a second ion implantation process is performed on substrate 1 again using polycrystalline gate electrode 7 and field oxidized film 5 as a mask. The second ion implantation process is carried out with a dose value of $3 \times 10^{15}$ cm$^{-2}$ of arsenic (As) ions at an acceleration voltage of 40 KeV. Thereafter, substrate 1 is heated at a second temperature of 600° C. for 180 minutes to form N-type regions 13 and 14 having a high impurity concentration and a depth smaller than that of diffusion regions 9 and 10 as shown in FIG. 2(d).

Figure 2E:
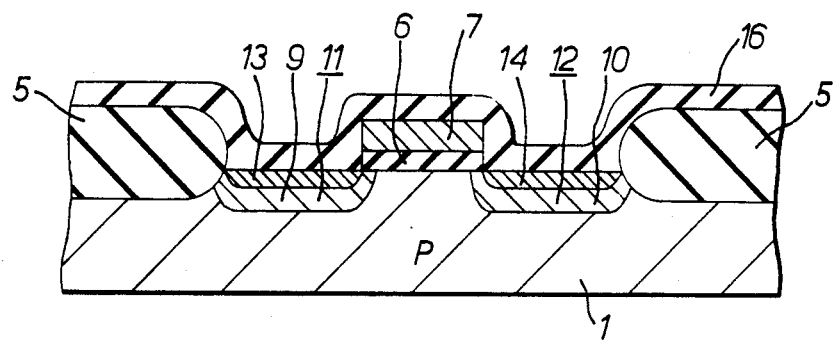
Figure 2F:
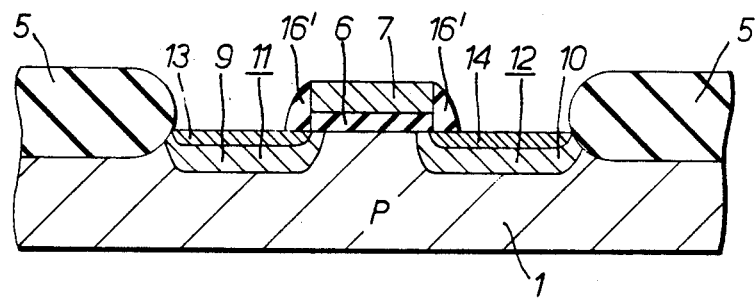

As shown in FIG. 2(e), film 16 of silicon dioxide is subsequently formed by a chemical vapor deposition process. Film 16 is anisotropically etched by a reactive ion etching process to leave only silicon-dioxide film 16' on the sidewalls of gate oxide film 6 and gate electrode 7 as shown in FIG. 2(f). The reactive ion etching process is performed at a normal temperature in a parallel plate plasma etching apparatus by introducing a mixture of hydrogen (10 ml/min.) and CF$_4$ (30 ml/min.). In the above etching process, silicon-dioxide film 16' remains on the sidewalls of gate oxide film 6 and gate electrode 7 because portions of film 16 having a steeper configuration are thicker than the other portions of film 16 so that it would take longer to completely etch these steeper portions. Silicon-dioxide film 16' enhances the electric insulation between source and drain regions 11 and 12 and gate electrode 7.

Figure 2G:
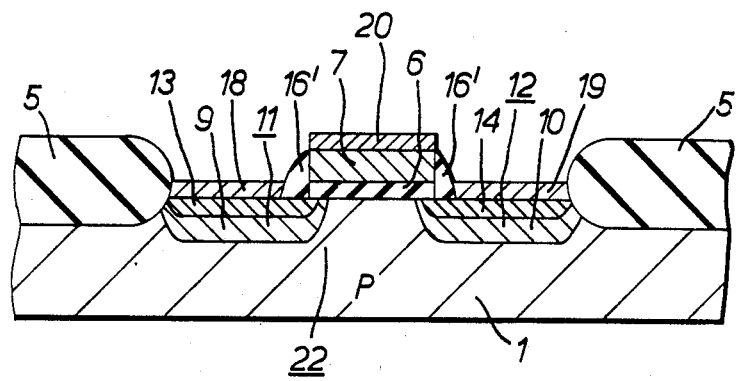

As shown in FIG. 2(g), tungsten films 18, 19 and 20, which have a thickness of 500 Angstrom units, are formed on source and drain regions 11 and 12 and on gate electrode 7, respectively, by a selective chemical vapor deposition process. These films 18, 19 and 20 can be formed by exposing substrate 1 to a mixture of hydrogen and $WF_6$ under a pressure of 0.2 torr and at a temperature of 350° and 450° C., with mol ratio $H_2/WF_6$ of 100, for example. Tungsten films 18 and 19 are in good ohmic contact with N-type regions 13 and 14 which have been heated at low temperature. Although diffusion regions 9 and 10 are shallow and of low impurity concentration and relatively high resistance, their sheet resistivity is small due to the existence of low resistance tungsten films 18 and 19, so that high speed operation of MOS transistor 22 is ensured. It is preferable to form tungsten films 18 and 19 in a self-aligned manner by selective chemical vapor deposition because the resistance of the surfaces of source and drain regions 11 and 12 can be made small over a wide area. Diffusion regions 9 and 10 serve to determine the principal characteristics of the MOS transistor, such as threshold voltage. Also, when a voltage is applied to drain region 12, the concentration of the electric field generated in the vicinity of region 12 is reduced because of the presence of diffusion region 10 of a low impurity concentration. Accordingly, the threshold voltage of MOS transistor 22 is not effected by the phenomenon of hot electrons being trapped in gate insulating film 6.

Figure 2H:
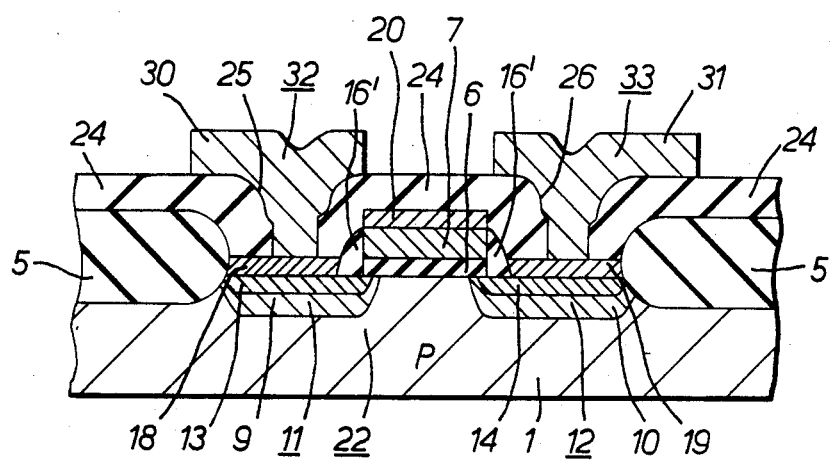

After tungsten films 18, 19 and 20 are formed, film 24 of silicon dioxide is deposited by a plasma chemical vapor deposition process as illustrated in FIG. 2(h). Thereafter, substrate 1 is heated at 600° C., and then contact holes 25 and 26 are engraved in silicon-dioxide film 24 by a conventional photoengraving process. Silicon-dioxide film 24 is deposited on substrate 1 at 450° C. in a gas mixture of silane and oxygen. The above heat treatment at 600° C. improves the adhesion of silicon-dioxide film 24. Then, an aluminum film is formed all over substrate 1 at 130° C. by sputtering, and it is selectively etched by a conventional photoengraving process so that aluminum films 30 and 31 are formed. Patterned aluminum films 30 and 31, which serve as electric leads from the source and drain regions, constitute source and drain electrodes 32 and 33 together with tungsten films 18 and 19. For example, when substrate 1 and source region 32 are grounded and a positive voltage of a few volts is applied to drain electrode 31 and gate electrode 7, MOS transistor 22 can be turned on.

In the aforementioned embodiment of the present invention, all steps subsequent to the formation of diffusion regions 9 and 10 are performed at a temperature of 700° C. or lower, and hence undesirable diffusion of impurities can be reduced. Thus, the method of the present invention is suitable for the fabrication of MOS transistors for large scale integration. Several modifications of the above method are possible. For example, diffusion regions 9 and 10 and N-type regions 13 and 14 may be formed by using phosphorous or boron instead of arsenic. When boron is employed, the silicon substrate must have an N-type conductivity. Also, adequate ohmic contact can be obtained by implanting silicon ions in regions 13 and 14 instead of having these regions be N-type regions. To sufficiently activate diffusion regions 9 and 10, the first temperature for the first heating process may be a temperature of 900° to 1300° C. Source and drain electrodes 32 and 33 may comprise a metal of a small resistivity, for example, aluminum, a refractory metal or their silicides. The source and drain electrodes also may consist of only one kind of metal. Furthermore, the dose of ions implanted into substrate 1 to form diffusion regions 9 and 10 may be on the order of $10^{13}$ through $10^{15}$ cm$^{-2}$ to enable these regions to serve sufficiently as the source and drain. The dose of ions implanted into substrate 1 to form diffusion regions 13 and 14 may be on the order of $10^{14}$ through $10^{16}$ cm$^{-2}$ to achieve sufficient contact resistance.

Although a certain preferred embodiment of the present invention has been shown and described, and several modifications have been suggested, it should be understood that many additional changes and modifications may be made therein without departing from the scope and spirit of the appended claims.

I claim:

1. A method of manufacturing an insulated-gate field-effect transistor on a silicon substrate of a first conductivity type comprising the steps of:
    (a) forming an insulating layer around a predetermined surface portion of said substrate;
    (b) forming a gate insulating film and a gate electrode on a portion of said predetermined surface portion, said gate electrode being formed on said gate insulating film;
    (c) implanting impurity ions into said predetermined surface portion between said insulating layer and said gate elecctrode to form source and drain regions of a second conductivity type having a low impurity concentration, said source and drain regions being spaced apart;
    (d) heating said substrate at a first temperature in the range of 900° to 1300° C.;
    (e) implanting ions of said second conductivity type into said source and drain regions;
    (f) heating said substrate at a second temperature at or below 700° C.; and
    (g) forming metal electrodes in ohmic contact with said source and drain regions, respectively.

2. A method according to claim 1 wherein the ions implanted by step (e) increase the impurity concentration of said source and drain regions.

3. A method according to claim 1 wherein the ions implanted by step (e) are silicon ions.

4. A method according to claim 1 wherein the ions implanted by step (c) are selected from the group consisting of As, P and B.

5. A method according to claim 1 wherein the ions implanted by step (e) are selected from the group consisting of As, P and B.

6. A method according to claim 1 wherein said ions are implanted into said substrate in steps (c) and (e) using said gate electrode as a mask.

7. A method according to claim 1 wherein said second temperature is in the range of 500° to 700° C.

8. A method according to claim 1 wherein all steps subsequent to heating step (f) are performed at or below 700° C.

9. A method according to claim 1 wherein said metal electrodes are made of aluminum or tungsten.

10. A method according to claim 1 wherein each of said metal electrodes comprises a refractory metal film in contact with said source and drain regions and an aluminum film formed on said refractory metal film, said refractory metal film being formed by selective chemical vapor deposition.

11. A method according to claim 10 further comprising the step of forming an insulating film on the sidewalls of said gate electrode before formation of said metal electrodes and after heating said substrate at said second temperature.

12. A method according to claim 11 wherein said metal electrodes substantially cover the surface of said source and drain regions.

13. A method according to claim 1 wherein the dose of said impurity ions is on the order of $10^{13}$ to $10^{15}$ cm$^{-2}$.

14. A method according to claim 1 wherein the dose of said ions implanted in step (e) is on the order of $10^{14}$ to $10^{16}$ cm$^{-2}$.

* * * * *